United States Patent
Lim et al.

(10) Patent No.: US 9,406,727 B2
(45) Date of Patent: Aug. 2, 2016

(54) DUAL-MODE PIXELS INCLUDING EMISSIVE AND REFLECTIVE DEVICES, AND DUAL-MODE DISPLAY USING THE PIXELS

(71) Applicant: ELECTRONICS AND TELECOMMUNICATIONS RESEARCH INSTITUTE, Daejeon (KR)

(72) Inventors: Jong Tae Lim, Seoul (KR); Joon Tae Ahn, Daejeon (KR); Jeong Ik Lee, Daejeon (KR); Hye Yong Chu, Daejeon (KR); Byoung Gon Yu, Yeongdong-gun (KR); Jonghee Lee, Daejeon (KR); Jun-Han Han, Daejeon (KR); Jaehyun Moon, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 14/931,945

(22) Filed: Nov. 4, 2015

(65) Prior Publication Data

US 2016/0079319 A1 Mar. 17, 2016

Related U.S. Application Data

(62) Division of application No. 14/335,154, filed on Jul. 18, 2014, now Pat. No. 9,209,232.

(30) Foreign Application Priority Data

Dec. 2, 2013 (KR) .......................... 10-2013-0148556

(51) Int. Cl.
*H01L 27/32* (2006.01)
*H01L 51/52* (2006.01)

(52) U.S. Cl.
CPC .......... *H01L 27/3232* (2013.01); *H01L 27/322* (2013.01); *H01L 27/3211* (2013.01);
(Continued)

(58) Field of Classification Search
CPC ............ H01L 27/3232; H01L 27/3211; H01L 27/322; H01L 51/5271; H01L 51/5215; H01L 51/5234; H01L 2251/308; H01L 2251/306; H01L 2251/305; H01L 2251/5323
See application file for complete search history.

(56) References Cited

U.S. PATENT DOCUMENTS 5,998,805 A * 12/1999 Shi ...................... H01L 51/5092
257/103
6,111,361 A * 8/2000 Xu ....................... G09G 3/3225
257/40

(Continued)

FOREIGN PATENT DOCUMENTS

KR 10-2014-0081921 A 7/2014

*Primary Examiner* — Ida M Soward
(74) *Attorney, Agent, or Firm* — Rabin & Berdo, P.C.

(57) ABSTRACT

A dual-mode display including a substrate and a plurality of sub-pixels on the substrate, in which each sub-pixel includes, a reflective device having an optical filter function which reflects different color according to electrical signals applied from outside the display, and an emissive device disposed on the reflective device, wherein the emissive device includes a cathode and an anode, and the cathode and the anode include a carbon-based material including graphene sheets, graphene flakes, and graphene platelets, and a binary or ternary transparent conductive oxide including indium oxide, tin oxide, and zinc oxide.

5 Claims, 11 Drawing Sheets

(52) U.S. Cl.
CPC ........ *H01L27/3262* (2013.01); *H01L 51/5215* (2013.01); *H01L 51/5234* (2013.01); *H01L 51/5271* (2013.01); *H01L 2251/305* (2013.01); *H01L 2251/306* (2013.01); *H01L 2251/308* (2013.01); *H01L 2251/5323* (2013.01)

(56) References Cited

U.S. PATENT DOCUMENTS

| | | | |
|---|---|---|---|
| 6,163,348 A | 12/2000 | Izumi et al. | |
| 7,170,506 B2 | 1/2007 | Eldon et al. | |
| 7,440,055 B2 * | 10/2008 | Nam | G02F 1/133371 349/114 |
| 7,450,199 B2 * | 11/2008 | Jang | G02F 1/133553 349/113 |
| 8,987,718 B2 | 3/2015 | Koo et al. | |
| 9,025,233 B2 | 5/2015 | Ryu et al. | |
| 9,039,266 B2 | 5/2015 | Gibson | |
| 9,287,332 B2 * | 3/2016 | Hatano | H01L 51/5265 |
| 2010/0053516 A1 | 3/2010 | Lu et al. | |
| 2011/0267279 A1 | 11/2011 | Alvarez Rivera et al. | |
| 2011/0316899 A1 | 12/2011 | Lan | |
| 2013/0208022 A1 | 8/2013 | Ryu et al. | |
| 2014/0055833 A1 | 2/2014 | Gibson et al. | |
| 2014/0158997 A1 | 6/2014 | Ahn et al. | |
| 2014/0340430 A1 * | 11/2014 | Telfer | G09G 3/344 345/690 |
| 2015/0286340 A1 * | 10/2015 | Send | G01S 17/46 345/175 |
| 2015/0340637 A1 * | 11/2015 | Yamazaki | H01L 33/504 257/89 |
| 2016/0013435 A1 * | 1/2016 | Seo | H01L 33/002 257/40 |

* cited by examiner

DUAL-MODE PIXELS INCLUDING EMISSIVE AND REFLECTIVE DEVICES, AND DUAL-MODE DISPLAY USING THE PIXELS

CROSS-REFERENCE TO RELATED APPLICATIONS

This is a second divisional of co-pending U.S. application Ser. No. 14/335,154, filed Jul. 18, 2014, and now allowed on Aug. 5, 2015, which claims priority under 35 U.S.C. §119 of Korean Patent Application No. 10-2013-0148556, filed on Dec. 2, 2013, the entire contents of which are hereby incorporated by reference.

BACKGROUND

The present invention disclosed herein relates to dual-mode pixels including emissive device and reflective device, and dual-mode displays using the dual-mode pixels, and more particularly, to dual-mode pixels including emissive device and reflective device which have more improved color reproducibility, and dual-mode displays using the dual-mode pixels.

Typical display techniques may be broadly classified as a transmissive display, an emissive display, and a reflective display. A typical example of the transmissive display may be a thin film transistor liquid crystal display (TFT-LCD). Since TFT-LCDs have excellent picture quality, the TFT-LCDs are used in TVs, monitors, and mobile phones, and currently lead the display market. However, TFT-LCDs may have high power consumption and may not be flexible.

Typical examples of the emissive display may be an organic light-emitting display (OLED) and a plasma display panel (PDP). Since a pixel itself may emit light in the emissive display, the emissive display may have a fast response speed and a high contrast ratio, and may have better color reproducibility than LCDs. Also, since ultra-thin OLEDs may be manufactured, OLEDs are used in a flexible display or a transparent display.

The reflective display may include an electrophoretic display, an electrowetting display, a photonic crystal display, and a microelectromechanical system. The reflective display may be operated by reflecting external light such as sunlight and lighting. Therefore, the reflective display may generate a clearer picture as the surroundings become brighter, and since it is operated by the external light, its power consumption may be low. However, the reflective display may have poorer picture quality than the transmissive display and the emissive display.

The transmissive display and the emissive display may have clear picture quality indoors or in dark places. However, the transmissive display and the emissive display may have poor visibility outdoors or in bright places. Therefore, research has been conducted on displays which may provide clear images both indoors and outdoors, and may have low energy consumption.

SUMMARY

The present invention provides a dual-mode pixel including emissive device and reflective device which has more improved color reproducibility and a dual-mode display using the dual-mode pixel.

The object of the present invention is not limited to the aforesaid, but other objects not described herein will be clearly understood by those skilled in the art from descriptions below.

Embodiments of the present invention provide dual-mode displays including: a substrate; and a plurality of sub-pixels on the substrate, wherein each sub-pixel includes an emissive device; a color selection reflector disposed on one side of the emissive device; and an optical shutter disposed on another side of the emissive device, wherein the emissive device includes a cathode and an anode, and the cathode and the anode include a carbon-based material including graphene sheets, graphene flakes, and graphene platelets, and a binary or ternary transparent conductive oxide including indium oxide, tin oxide, and zinc oxide.

In some embodiments, the emissive device may be an organic light-emitting device.

In other embodiments, the color selection reflector may be a Fabry-Pérot optical filter, a photonic crystal optical filter, an absorptive optical filter, or a transmissive optical filter including a reflector.

In still other embodiments, the optical shutter may be operated in an electrophoretic mode, an electrowetting mode, an electrochromic mode, or a liquid crystal mode.

In even other embodiments, the emissive device may emit light from both sides thereof.

In yet other embodiments, the color selection reflector may reflect light of the emissive device that is emitted in a direction of the color selection reflector.

In further embodiments, the dual-mode display may further include a thin film transistor between the substrate and the sub-pixels.

In still further embodiments, the dual-mode display may further include a thin film transistor between the emissive device and the optical shutter.

In other embodiments of the present invention, dual-mode displays include: a substrate; and a plurality of sub-pixels on the substrate, wherein each sub-pixel includes a color selection reflector; an optical shutter disposed on the color selection reflector; and an emissive device disposed on the optical shutter, wherein the emissive device includes a cathode and an anode, and the cathode and the anode include a carbon-based material including graphene sheets, graphene flakes, and graphene platelets, and a binary or ternary transparent conductive oxide including indium oxide, tin oxide, and zinc oxide.

In some embodiments, the emissive device may be an organic light-emitting device.

In other embodiments, the color selection reflector may be a Fabry-Pérot optical filter, a photonic crystal optical filter, an absorptive optical filter, or a transmissive optical filter including a reflector.

In still other embodiments, the optical shutter may be operated in an electrophoretic mode, an electrowetting mode, an electrochromic mode, or a liquid crystal mode.

In still other embodiments of the present invention, dual-mode displays include: a substrate; and a plurality of sub-pixels on the substrate, wherein the plurality of sub-pixels include a reflective device having an optical filter function which reflects different colors according to electrical signals applied from outside; and an emissive device disposed on the reflective device, wherein the emissive device includes a cathode and an anode, and the cathode and the anode include a carbon-based material including graphene sheets, graphene flakes, and graphene platelets, and a binary or ternary transparent conductive oxide including indium oxide, tin oxide, and zinc oxide.

In some embodiments, the emissive device may be an organic light-emitting device.

In other embodiments, the emissive device may emit light from both sides thereof.

In still other embodiments, the reflective device may reflect light of the emissive device that is emitted in a direction of the reflective device.

In even other embodiments, the reflective device may be a microelectromechanical system (MEMS)-based reflective device, an electrowetting device, or an electrochromic device.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE EMBODIMENTS

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals denote like elements throughout the specification.

In the following description, the technical terms are used only for explaining specific embodiments while not limiting the present invention. The terms of a singular form may include plural forms unless referred to the contrary. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a device region. Thus, this should not be construed as limited to the scope of the present invention.

Figure 1:
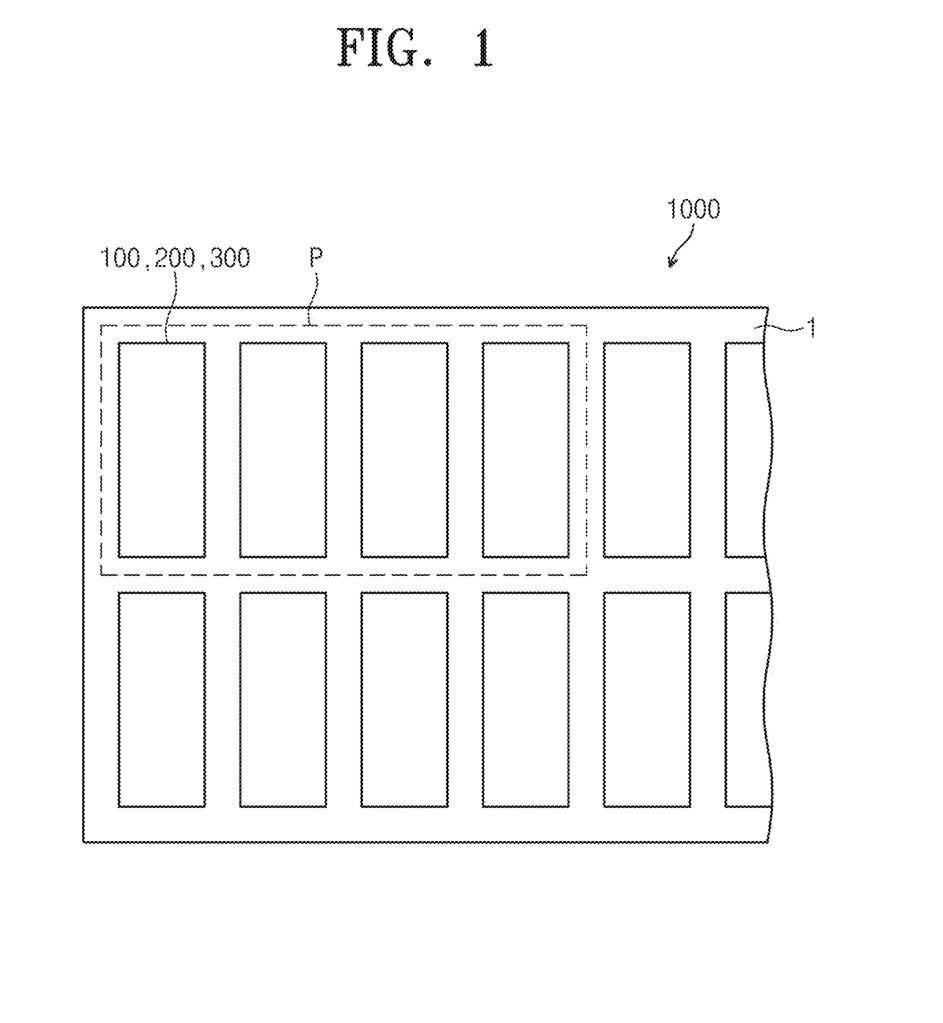
FIG. 1 is a plan view illustrating a dual-mode display including dual-mode pixels according to embodiments of the present invention.

FIG. 1 is a plan view illustrating a dual-mode display including dual-mode pixels according to embodiments of the present invention.

Referring to FIG. 1, a dual-mode display 1000 includes a plurality of sub-pixels 100, 200, and 300 that are disposed on a substrate 1. Each of the sub-pixels 100, 200, and 300 may be configured to display red, green, or blue. A red colored sub-pixel, a green colored sub-pixel, and a blue colored sub-pixel may be defined as a single pixel P. A white colored sub-pixel may be further included in the pixel. The dual-mode display 1000 may realize still images and videos by simultaneously driving the sub-pixels 100, 200, and 300.

Figure 2:
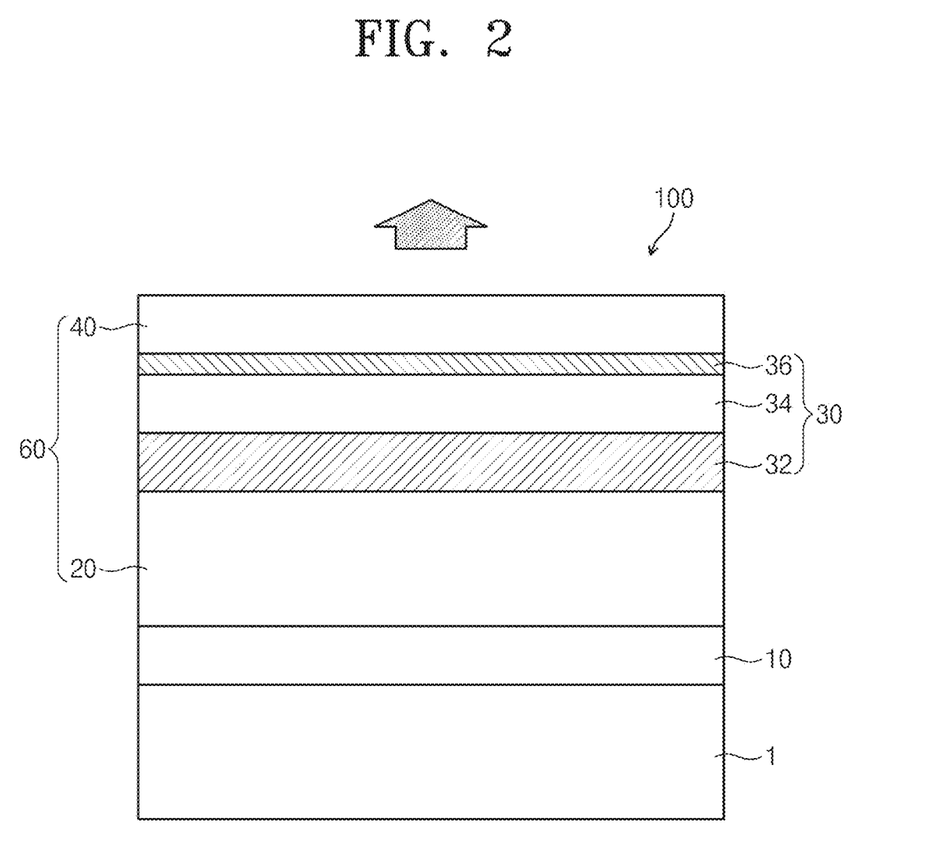
FIG. 2 is a cross-sectional view illustrating a dual-mode pixel including an emissive device and a reflective device according to Embodiment 1 of the present invention.
Figure 3:
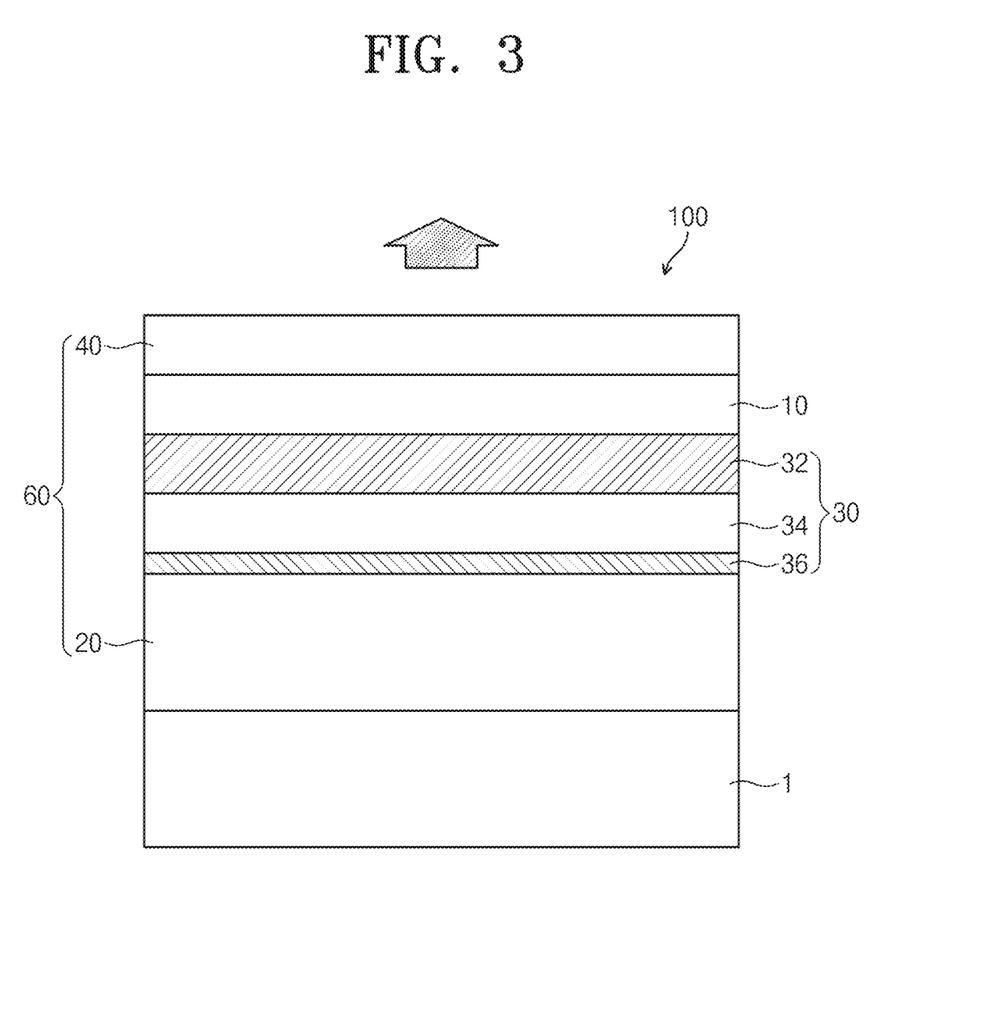
FIG. 3 is a cross-sectional view illustrating a dual-mode pixel including an emissive device and a reflective device according to Embodiment 2 of the present invention.

FIG. 2 is a cross-sectional view illustrating a dual-mode pixel including an emissive device and a reflective device according to Embodiment 1 of the present invention. FIG. 3 is a cross-sectional view illustrating a dual-mode pixel including an emissive device and a reflective device according to Embodiment 2 of the present invention.

Referring to FIG. 2, the sub-pixel 100 includes an emissive device 30 and a reflective device 60. Specifically, a color selection reflector 20 may be disposed on one side of the emissive device 30, and an optical shutter 40 may be disposed on the other side of the emissive device 30. The reflective device 60 may include the color selection reflector 20 and the optical shutter 40. The sub-pixel 100 may further include a thin film transistor 10. The thin film transistor 10 may be disposed between the substrate 1 and the color selection reflector 20. The thin film transistor 10 may be transparent or opaque. The thin film transistor 10 may play a role to control and/or switch electrical signals of the emissive device 30 and the optical shutter 40.

The color selection reflector 20, the emissive device 30, and the optical shutter 40 may be vertically stacked on a single substrate to form the sub-pixels 100, 200, and 300. Alternatively, the color selection reflector 20, the emissive device 30, and the optical shutter 40 may be formed on different substrates and may then be vertically stacked on a single substrate to form the sub-pixels 100, 200, and 300. The substrate 1 may be a flexible substrate. The flexible substrate, for example, may be a plastic, thin glass, or metal substrate.

The color selection reflector 20 may be a Fabry-Perot optical filter, a photonic crystal optical filter, an absorptive optical filter, or a transmissive optical filter including a reflector.

The Fabry-Pérot optical filter has a structure in which a cavity formed of a dielectric material is inserted between metal layers having high reflectance. Among the light incident on the Fabry-Perot optical filter, light in a specific wavelength range is reflected and light in the remaining wavelength range is transmitted by a multiple interference phenomenon of the cavity. The Fabry-Pérot optical filter may include a silver (Ag) film, a silicon ($SiO_2$) film, a tungsten (W) film, and a silicon oxide ($SiO_2$) film that are sequentially stacked on a substrate.

The photonic crystal optical filter controls the reflection or absorption of light having a specific wavelength that is incident from the outside by using a nanostructure having a size smaller than the light in a specific wavelength range, and thus, the photonic crystal optical filter may transmit light having a desired wavelength and may reflect light having the remaining wavelength.

The absorptive optical filter reflects light having a color to be displayed and absorbs other lights having unwanted colors.

In the transmissive optical filter including a reflector, light in a specific wavelength among the incident light is transmitted through the transmissive optical filter to be reflected by the reflector.

The emissive device 30 may be an organic light-emitting device. The emissive device 30 is not limited to the organic light-emitting device, and any emissive device may be used so long as it is flexible and may be used to fabricate a display. The emissive device 30 may emit specific colored light from both sides thereof.

The emissive device 30 may include an anode 32, an organic layer 34, and a cathode 36 that are sequentially stacked on the color selection reflector 20. The organic layer 34 may include a hole injection layer, a hole transport layer, an emission layer, an electron transport layer, and an electron injection layer.

The anode 32 and the cathode 36 may include a material having low reflectance and high transmittance. The anode 32 and the cathode 36, for example, may be a carbon-based material including graphene sheets, graphene flakes, and graphene platelets, and a binary or ternary transparent conductive oxide including indium oxide, tin oxide, and zinc oxide. The emissive device 30 may emit light in both directions.

The optical shutter 40 may be operated in an electrophoretic mode, an electrowetting mode, an electrochromic mode, or a liquid crystal mode. The optical shutter 40 may transmit or block external light and light formed in the emissive device 30.

Electrophoresis is a phenomenon in which charged particles in a state of being dispersed in a fluid are moved by an electric field. In the electrophoretic mode, the particles may function as an optical shutter using the electrophoresis by being adsorbed or non-adsorbed on the surface of an electrode according to whether or not a voltage is applied to the electrode. The electrophoretic mode may have an optical switching speed of about 1 second (sec).

Electrowetting is a phenomenon in which a conductive fluid having a polar group and high transmittance and a colored non-polar oil are moved by an electric field. In the electrowetting mode, the colored non-polar oil may function as an optical shutter by shrinking or not shrinking in one direction according to whether or not a voltage is applied between the electrodes. The electrowetting mode may have an optical switching speed of about 10 milliseconds (msecs).

Electrochromic is a phenomenon in which reversible changes of optical properties are electrochemically performed by an oxidation or reduction process. The electrochromic mode may have an optical switching speed of about 100 msecs.

The liquid crystal mode uses a property in which a screen becomes transparent or blackened according to the fact that the orientation of liquid crystals is changed when a voltage is applied to the liquid crystals having a dye mixed therein. The liquid crystal mode may have an optical switching speed of a few msecs.

When the optical shutter 40 is opened and the emissive device 30 is operated, light formed in the emissive device 30 may be emitted to the outside through the optical shutter 40.

A portion of the light oriented in a direction of the color selection reflector 20 among the light formed in the emissive device 30 may be reflected by or transmitted through the color selection reflector 20. The color selection reflector 20 may be configured to have different reflectances according to the thickness of the color selection reflector 20 and the wavelength of the portion of the light. In order for the portion of the light formed in the emissive device 30 to be reflected by the color selection reflector 20, the color selection reflector 20 may be controlled to reflect a wavelength range of the portion of the light.

When the optical shutter 40 is opened and the emissive device 30 is not operated, external light may be reflected by or transmitted through the color selection reflector 20 by passing through the optical shutter 40 and the emissive device 30. The sub-pixels 100 may be operated by the light reflected by the color selection reflector 20.

When the optical shutter 40 is closed, since the optical shutter 40 blocks the light of the emissive device 30 even in the case in which the emissive device 30 is operated, the sub-pixel 100 may be configured to display black.

When the emissive device 30, the color selection reflector 20, and the optical shutter 40 are integrated into the single sub-pixel 100, the emissive device 30 may not be operated but the sub-pixel 100 may be operated by using the color selection reflector 20 in bright places or outdoors, and the emissive device 30 may be operated in dark places or indoors. As a result, the dual-mode display 1000 may provide more improved picture quality regardless of external environment.

Referring to FIG. 3, in the sub-pixel 100 according to Embodiment 2 of the present invention, the thin film transistor 10 may be disposed between the emissive device 30 and the optical shutter 40. The thin film transistor 10 may be a transparent thin film transistor. The emissive device 30 may be disposed between the color selection reflector 20 and the thin film transistor 10, and may include the cathode 36, the organic layer 34, and the anode 32 which are sequentially stacked on the color selection reflector 20.

According to a driving method of the dual-mode display, a high transmissive and low reflective electrode material may be used for the anode 32 and the cathode 36 of the emissive device 30 in order to effectively emit the light generated by the emissive device 30 and the light reflected by the color selection reflector 20 outside the sub-pixels 100. According to an embodiment of the present invention, a graphene electrode or a transparent conductive electrode may be used as the anode 32 and the cathode 36 of the emissive device 30 so that color reproducibility and luminous efficiency of the dual-mode display 1000 may be improved.

Figure 4:
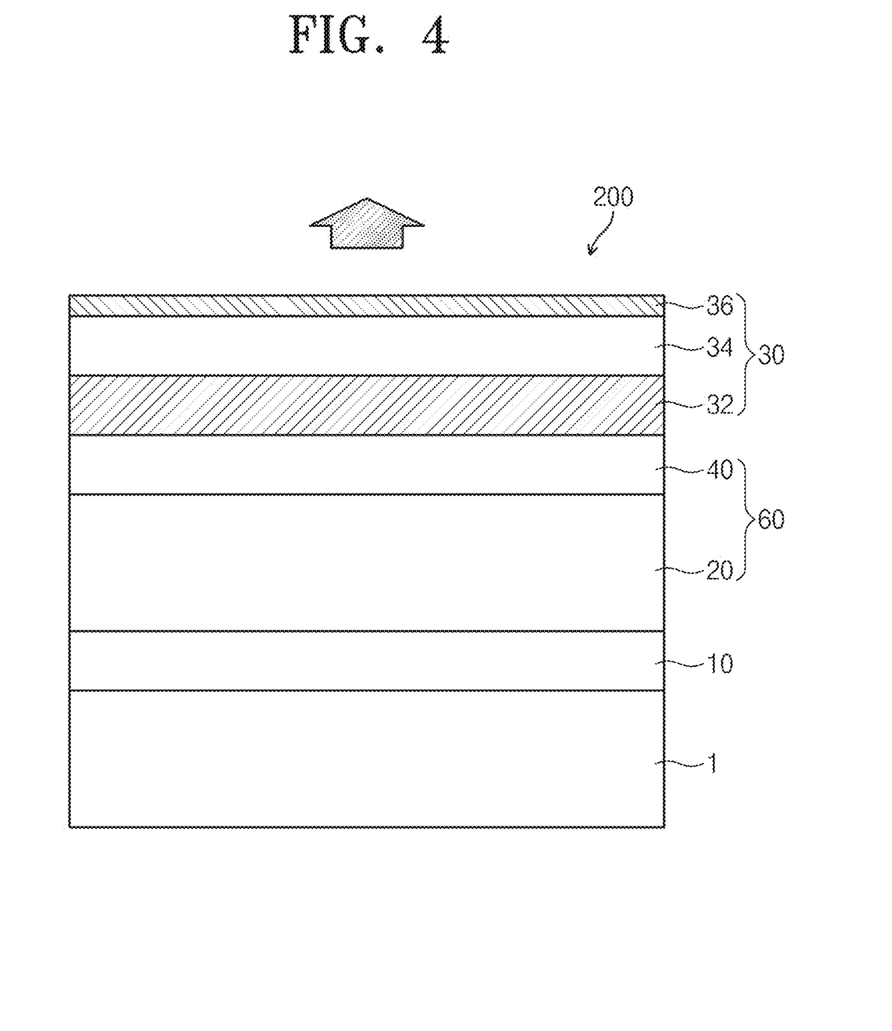
FIG. 4 is a cross-sectional view illustrating a dual-mode pixel including an emissive device and a reflective device according to Embodiment 3 of the present invention.

FIG. 4 is a cross-sectional view illustrating a dual-mode pixel including an emissive device and a reflective device according to Embodiment 3 of the present invention.

Referring to FIG. 4, the sub-pixel 200 may include the reflective device 60 and the emissive device 30 which are stacked on the substrate 1. The thin film transistor 10 may be disposed between the substrate 1 and the reflective device 60. The reflective device 60 may include the color selection reflector 20 and the optical shutter 40 which are sequentially stacked on the thin film transistor 10.

The anode 32 and the cathode 36 of the emissive device 30 may include a material having low reflectance and high transmittance. For example, the material may be a carbon-based material including graphene sheets, graphene flakes, and graphene platelets, and a binary or ternary transparent conductive oxide including indium oxide, tin oxide, and zinc oxide. The emissive device 30 may emit light from both sides thereof.

When the optical shutter 40 is closed and the emissive device 30 is operated, most of light emitted from the emissive device 30 may be emitted to the outside. However, a portion of the light emitted in a direction of the optical shutter 40 may not reach the color selection reflector 20 due to the optical shutter 40 and thus, the portion of the light may not be emitted to the outside.

When the optical shutter 40 is opened and the emissive device 30 is operated, most of the light emitted from the emissive device 30 may be directly emitted to the outside, and the portion of the light emitted in the direction of the optical shutter 40 may be emitted to the outside by penetrating the optical shutter 40 and the emissive device 30 after being reflected by the color selection reflector 20. As a result, the light formed on the both sides of the emissive device 30 may be emitted to the outside.

When the optical shutter 40 is opened and the emissive device 30 is not operated, external light is incident on the sub-pixel 200 and the incident external light may sequentially pass the emissive device 30 and the optical shutter 40 to transmit through or be reflected by the color selection reflector 20. The sub-pixel 200 may be operated by the light that is reflected by the color selection reflector 20.

Figure 5:
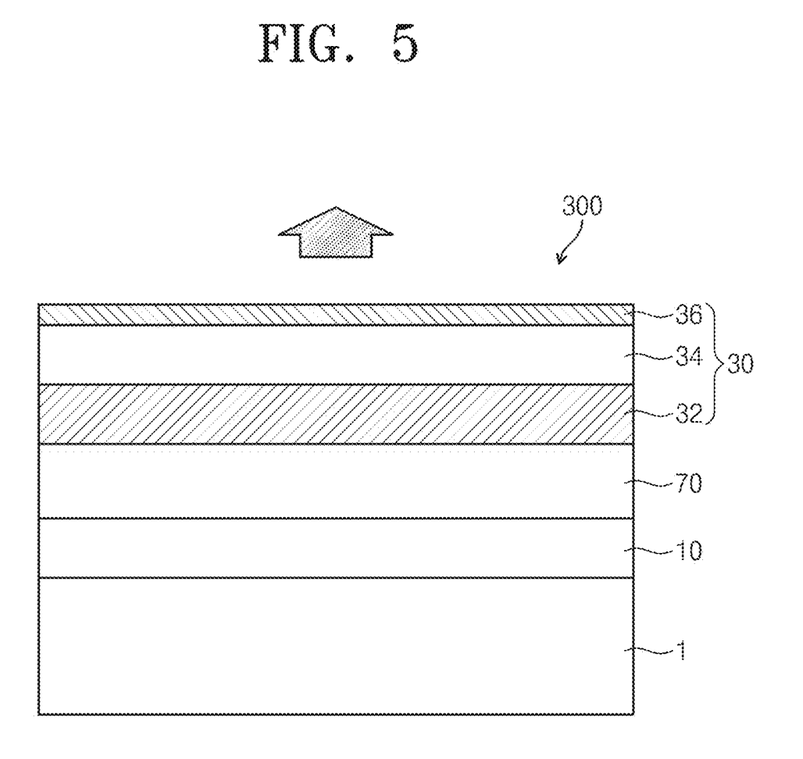
FIG. 5 is a cross-sectional view illustrating a dual-mode pixel including an emissive device and a reflective device according to Embodiment 4 of the present invention.

FIG. 5 is a cross-sectional view illustrating a dual-mode pixel including an emissive device and a reflective device according to Embodiment 4 of the present invention.

Referring to FIG. 5, the sub-pixel 300 may include a reflective device 70 and an emissive device 30 which are stacked on the substrate 1. The thin film transistor 10 may be disposed between the substrate 1 and the reflective device 70.

The reflective device 70 may have an optical filter function which reflects different colors according to electric signals that are applied to the reflective device 70. For example, the color reflected by the reflective device 70 when a voltage is applied to the reflective device 70 may be different from the color reflected by the reflective device 70 when a voltage is not applied to the reflective device 70. The reflective device 70 may be a microelectromechanical system (MEMS)-based reflective device, an electrowetting device, or an electrochromic device.

The MEMS-based reflective device may be a Fabry-Perot optical filter. The Fabry-Perot optical filter may include two metal substrates and a dielectric substrate disposed between the metal substrates. The dielectric substrate may be in contact with one of the metal substrates, and may be disposed and spaced apart from the other metal substrate. A spacing between the metal substrates may be changed according to an electric signal applied to the MEMS-based reflective device. Since the spacing between the metal substrates may be changed, the dielectric substrate may be in contact with the metal substrate that is spaced apart therefrom. A switching speed of the MEMS-based reflective device may be about a few tens of msec.

The color reflected by the MEMS-based reflective device may be changed according to the spacing between the metal substrates. For example, when a voltage is applied to the MEMS-based reflective device, the color reflected according to the spacing between the metal substrates may be any one of red, blue, green, and white. When a voltage is not applied to the MEMS-based reflective device, the color reflected according to the spacing between the metal substrates may be black.

The metal substrates may include any one element of Ag, aluminum (Al), gold (Au), cobalt (Co), chromium (Cr), nickel (Ni), and W. The dielectric substrate may be formed of a transparent dielectric material. The dielectric substrate, for example, may be a silicon dioxide ($SiO_2$) substrate or a titanium dioxide ($TiO_2$) substrate.

The electrowetting device may include two substrates and an electrowetting element which reversibly controls the transmission and reflection of the external light by an electric field between the substrates. The electrowetting device may include a colorless conductive fluid having a polar group and high transmittance and a colored non-polar oil. A switching speed of the electrowetting device may be about 10 msecs or less.

The driving principle of the electrowetting device is as follows: A voltage is applied to two electrode sheets that are disposed on the substrates and face to each other. An electric field is formed between the two substrates by the applied voltage and the colorless fluid having conductivity may be formed on surfaces of the substrates due to the electric filed. Therefore, the electrowetting device may be configured to display white. Alternatively, when a voltage is not applied to the two electrodes, the colored non-polar oil may be formed on the surfaces of the substrates. Therefore, since the external light is reflected by the colored non-polar oil, the electrowetting device may appear the color of the non-polar oil.

The electrochromic device is a display device which controls the color of an electrochromic material by controlling a chemical reaction by applying an electric signal. A switching speed of the electrochromic device may be about 100 msecs.

The driving principle of the electrochromic device is as follows: Two electrodes facing each other are included between the transparent substrates that are spaced apart from each other. An electrochromic layer, an electrolyte layer, and an ion storage may be sequentially disposed between the two electrodes. When a current flows from the electrochromic layer to the ion storage by the application of a voltage between the electrodes, the electrochromic layer may be colored, and when the current flows in an opposite direction, the electrochromic layer may be decolorized.

The emissive device 30 may be an organic light-emitting device. The anode 32 and the cathode 36 of the emissive device 30 may include a material having low reflectance and high transmittance. For example, the material may be a carbon-based material including graphene sheets, graphene flakes, and graphene platelets, and a binary or ternary transparent conductive oxide including indium oxide, tin oxide, and zinc oxide. The emissive device 30 is not limited to the organic light-emitting device, and any emissive device may be used so long as it is flexible and may be used to fabricate a display. The emissive device 30 may emit light from both sides thereof and may emit specific colored light.

When the emissive device 30 is not operated, external light may pass through the emissive device 30 to be transmitted or be reflected according to whether or not the reflective device 70 is operated. For example, in a case where the reflective device 70 is an electrowetting device and the electrowetting device is operated, the external light may transmit a colorless conducive fluid. As a result, the sub-pixel 300 may appear white. Alternatively, in a case where the electrowetting device is not operated, the external light may be reflected by the colored non-polar oil. Therefore, the sub-pixel 300 may appear the color of the colored non-polar oil.

When the emissive device 30 is operated, a portion of light among the light generated from the emissive device 30 may be emitted to the outside, and another portion of the light may be incident on the reflective device 70. The another portion of the light incident on the reflective device 70 may be reflected or may be transmitted according to whether or not the reflective device 70 is operated. For example, in a case where the reflective device 70 is an electrowetting device and the electrowetting device is not operated, the another portion of the light may be reflected by the colored non-polar oil to be configured to display the color of the non-polar oil. The luminous efficiency when the external light is incident or emitted by the driving of the reflective device 70 may be highly dependent on the transmittance and reflectance of the light in the emissive device 30. Therefore, color reproducibility and light emission efficiency may be improved by using a material having low reflectance and high transmittance in the anode 32 and the cathode 36 of the emissive device 30.

EXPERIMENTAL EXAMPLES

Color Selection Reflector Fabrication

All thin films constituting a color selection reflector were prepared by a vacuum process. A titanium (Ti) film was deposited on a cleaned silicon substrate to a thickness of 10 nm. The silicon substrate having the Ti film formed thereon was transferred using a load lock system, and a silver (Ag) film was then deposited on the Ti film to a thickness of 200 nm. The Ti film may strengthen the adhesion between the silicon substrate and the Ag film. In order to deposit a silicon oxide ($SiO_2$) film as a dielectric material while the vacuum was continuously maintained, the silicon substrate having the Ag film formed thereon was transferred to a plasma enhanced chemical vapor deposition apparatus to deposit a silicon oxide film having a predetermined thickness. A tungsten film was deposited on the silicon oxide film by using a sputtering apparatus. A center wavelength of the color selection reflector was determined by a thickness of a cavity formed between the Ag film and the tungsten film. For example, the silicon oxide film was formed to a thickness of 200 nm in order to form a red color selection reflector. The silicon oxide film was formed to a thickness of 340 nm in order to form a green color selection reflector. The silicon oxide film was formed to a thickness of 315 nm in order to form a blue color selection reflector. Finally, a silicon oxide film was deposited on the tungsten film to a thickness of 10 nm in order to provide insulation to the color selection reflector.

A center wavelength of the red color selection reflector was 662 nm, a center wavelength of the green color selection reflector was 536 nm, and a center wavelength of the blue color selection reflector was 476 nm. The reflectors exhibited a reflectance of 80% or more.

Fabrication of Dual-Emission Mode Organic Light-Emitting Device Sample

1. Fabrication of Sample Composed of Glass Substrate/Tin-doped Indium Oxide Film (70 nm)/Hole Injection Layer/Hole Transport Layer/Emission Layer/Electron Transport Layer/Electron Injection Layer A 70 nm thick tin-doped indium oxide film (ITO) was deposited on a cleaned glass substrate by using a sputtering apparatus. A hole injection layer, a hole transport layer, an emission layer, an electron transport layer, and an electron injection layer were sequentially deposited on the glass substrate having the ITO film formed thereon by using a thermal evaporator. The hole injection layer, hole transport layer, emission layer, electron transport layer, and electron injection layer may be defined as an organic part. A thickness of the organic part was differently designed and fabricated in order to match center wavelengths of a reflective device and an emissive device.

2. Fabrication of Dual-Emission Mode Organic Light-Emitting Diode having Silver Cathode An about 15 nm thick silver cathode was formed on the electron injection layer using a thermal evaporator. The organic part of a red organic light-emitting device was formed to have a thickness of 280 nm, the organic part of a green organic light-emitting device was formed to have a thickness of 220 nm, and the organic part of a blue organic light-emitting device was formed to have a thickness of 180 nm 3. Preparation of Graphene Cathode Sample Graphene having nickel and silicon substrate stacked thereon was adhered conformal contact to a polyethylene terephthalate (PET) film coated with a silicon release film. Thereafter, the nickel was etched for about 30 minutes by dipping the product thus prepared in a 10% iron (III) chloride ($FeCl_3$) aqueous solution. When the nickel was etched, the graphene was separated from the silicon substrate, and the graphene was formed by being stacked on the silicon release film. The silicon release film was sequentially washed with a dilute hydrochloric acid solution, a sodium borohydride ($NaBH_4$) aqueous solution, and distilled water, and dried in a vacuum drier at about 60° C. for about 1 hour. After the drying was completed, an elastomer was in conformal contact with the silicon release film to complete the silicon release film and the graphene which were sequentially stacked on the elastomer.

Figure 6:
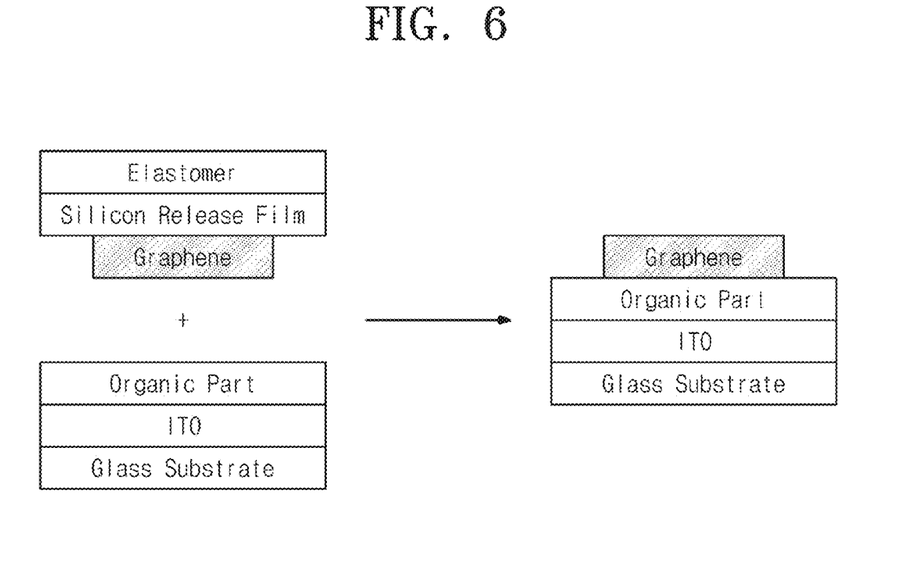
FIG. 6 is a cross-sectional view illustrating a dry transfer process of a graphene cathode according to an embodiment of the present invention.

4. Fabrication of Dual-Emission Mode Organic Light-Emitting Device having Graphene Cathode Referring to FIG. 6, the graphene cathode sample was in contact with the organic part of the organic light-emitting device sample in order for the graphene surface to be in contact therewith, and was transferred into a laminating chamber. The transferred organic light-emitting diode sample and the graphene cathode sample were laminated at 80° C. for about 10 minutes. The graphene was separated from the silicon release film by a physical force after 10 minutes to fabricate an organic light-emitting device having the graphene cathode stacked thereon.

5. Fabrication of Dual-Mode Display including Color election Reflector and Emissive Device Structure of Red Dual-Mode Display having Silver Cathode: a titanium film (10 nm), a silver film (200 nm), a silicon oxide film (200 nm), a tungsten film (8 nm), a silicon oxide film (10 nm), an ITO film (70 nm), an organic part (280 nm), and a silver film (15 nm), which were sequentially stacked on a silicon substrate, were included.

Structure of Green Dual-Mode Display having Silver Cathode: a titanium film (10 nm), a silver film (200 nm), a silicon oxide film (340 nm), a tungsten film (8 nm), a silicon oxide film (10 nm), an ITO film (70 nm), an organic part (220 nm), and a silver film (15 nm), which were sequentially stacked on a silicon substrate, were included.

Structure of Blue Dual-Mode Display having Silver Cathode: a titanium film (10 nm), a silver film (200 nm), a silicon oxide film (315 nm), a tungsten film (8 nm), a silicon oxide film (10 nm), an ITO film (70 nm), an organic part (180 nm), and a silver film (15 nm), which were sequentially stacked on a silicon substrate, were included.

Structure of Red Dual-Mode Display having Graphene Cathode: a titanium film (10 nm), a silver film (200 nm), a silicon oxide film (200 nm), a tungsten film (8 nm), a silicon oxide film (10 nm), an ITO film (70 nm), an organic part (240 nm), and a graphene film, which were sequentially stacked on a silicon substrate, were included.

Structure of Green Dual-Mode Display having Graphene Cathode: a titanium film (10 nm), a silver film (200 nm), a silicon oxide film (340 nm), a tungsten film (8 nm), a silicon oxide film (10 nm), an ITO film (70 nm), an organic part (170 nm), and a graphene film, which were sequentially stacked on a silicon substrate, were included.

Structure of Blue Dual-Mode Display having Graphene Cathode: a titanium film (10 nm), a silver film (200 nm), a silicon oxide film (315 nm), a tungsten film (8 nm), a silicon oxide film (10 nm), an ITO film (70 nm), an organic part (180 nm), and a graphene film, which were sequentially stacked on a silicon substrate, were included.

Figure 7:
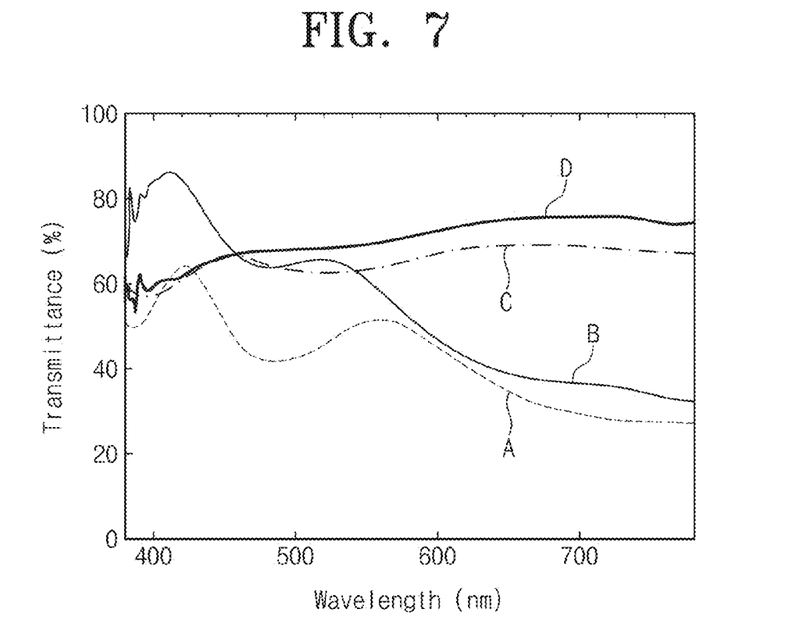
FIG. 7 is a graph illustrating transmittance spectra of an organic light-emitting device having a silver cathode and an organic light-emitting device having a graphene cathode in a visible light region according to an embodiment of the present invention.

FIG. 7 is a graph illustrating transmittance spectra of an organic light-emitting device having a silver cathode and an organic light-emitting device having a graphene cathode in a visible light region according to an embodiment of the present invention.

A and C respectively represent the results of the simulation of the organic light-emitting devices having a silver cathode and a graphene cathode, and B and D respectively represent the results of the measurement of the organic light-emitting devices having a silver cathode and a graphene cathode.

Referring to FIG. 7, the organic light-emitting device having a silver cathode exhibited a transmittance of about 40% to about 80% in a visible light wavelength range. That is, since the transmittance was non-uniform according to the wavelength, it may be estimated that light with various wavelengths may not transmit the silver cathode. In contrast, the organic light-emitting device having a graphene cathode exhibited a transmittance of about 60% to about 70% in a visible light wavelength range. In general, it may be estimated that the graphene cathode had a uniform transmittance according to the wavelength in comparison to the silver cathode, and thus, the light with various wavelengths may uniformly transmit the graphene cathode. As a result, it may be understood that the organic light-emitting device having a graphene cathode had high-transmittance optical properties and uniform transmittance in comparison to the organic light-emitting device having a silver cathode.

Figure 8:
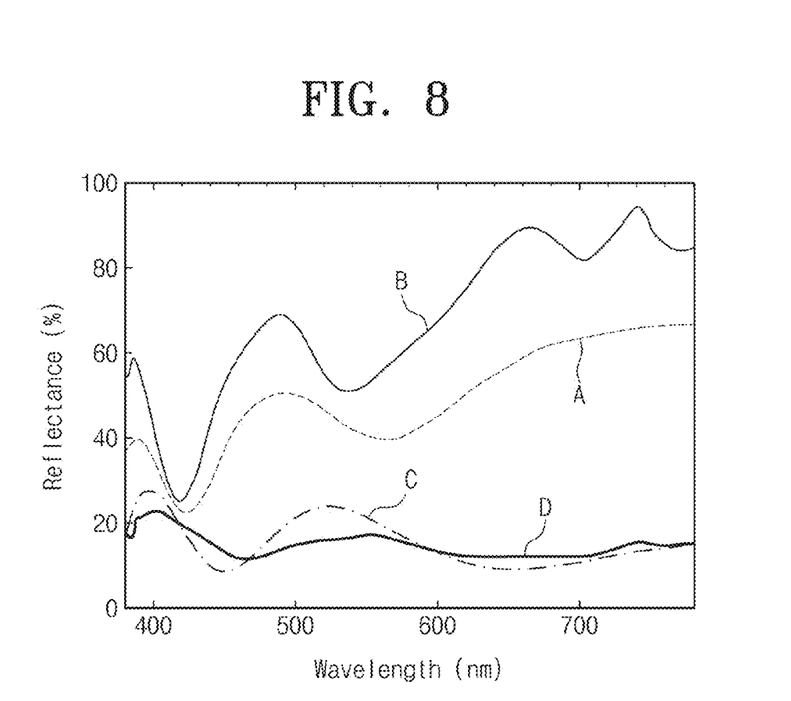
FIG. 8 is a graph illustrating reflectance spectra of an organic light-emitting device having a silver cathode and an organic light-emitting device having a graphene cathode in a visible light region according to an embodiment of the present invention.

FIG. 8 is a graph illustrating reflectance spectra of an organic light-emitting device having a silver cathode and an organic light-emitting device having a graphene cathode in a visible light region according to an embodiment of the present invention.

A and C respectively represent the results of the simulation of the organic light-emitting devices having a silver cathode and a graphene cathode, and B and D respectively represent the results of the measurement of the organic light-emitting devices having a silver cathode and a graphene cathode.

Referring to FIG. 8, the organic light-emitting device having a silver cathode exhibited a reflectance of about 30% to about 90% in a visible light wavelength range. That is, it may be estimated that the reflectance was non-uniform according to the wavelength and since the reflectance was increased as the wavelength increased, desired light may not transmit. In contrast, the organic light-emitting device having a graphene cathode exhibited a reflectance of about 20% or less over an entire visible light wavelength range and the reflectance was uniform over the entire wavelength range. As a result, it may be understood that the organic light-emitting device having a graphene cathode had low-reflectance optical properties and uniform reflectance in comparison to the organic light-emitting device having a silver cathode.

Figure 9:
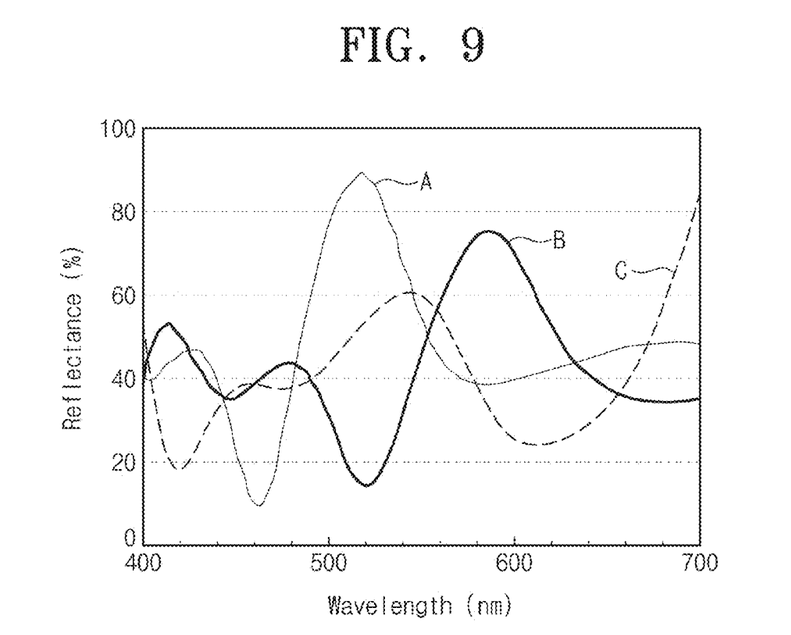
FIG. 9 is a graph illustrating reflectance spectra in a visible light wavelength range of a dual-mode display which includes a reflective device and an emissive device including a silver cathode that is stacked on the reflective device according to an embodiment of the present invention.

FIG. 9 is a graph illustrating reflectance spectra in a visible light wavelength range of a dual-mode display which includes a reflective device and an emissive device including a silver cathode that is stacked on the reflective device according to an embodiment of the present invention.

A represents a blue reflectance spectrum, B represents a green reflectance spectrum, and C represents a red reflectance spectrum.

Referring to FIG. 9, it may be understood that high non-uniform noise peaks were generated in the blue, green, and red reflectance spectra. In addition, it may be understood that center wavelengths of the three-color reflectance spectra were shifted to a red color. The generation of the high noise peaks and the shift of the center wavelengths occurred due to a multiple interference phenomenon generated from multi cavities disposed between the anode formed of highly reflective silver, tungsten, and tin-doped indium oxide, and the silver cathode, which constituted the red dual-mode display.

Figure 10:
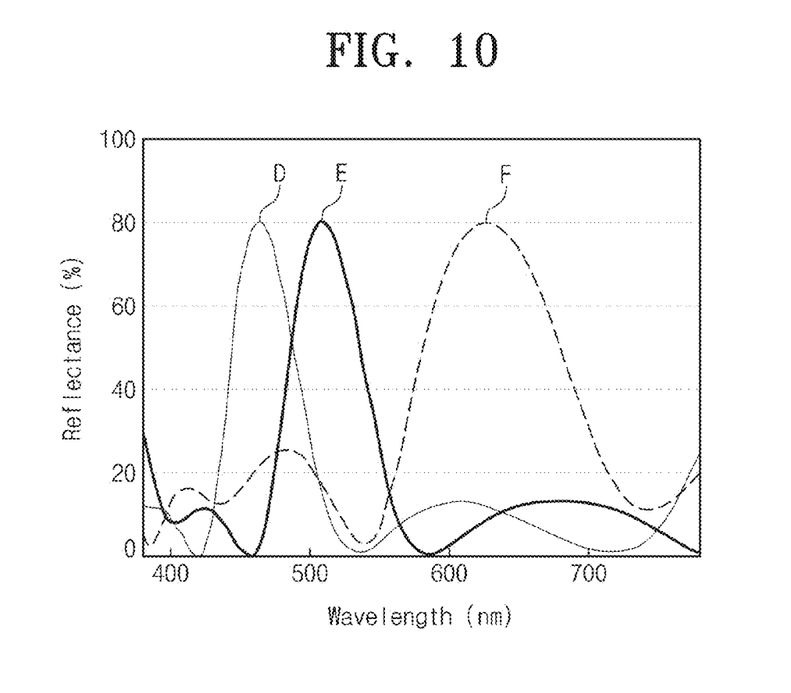
FIG. 10 is a graph illustrating reflectance spectra in a visible light wavelength range of a dual-mode display which includes a reflective device and an emissive device including a graphene cathode that is stacked on the reflective device according to an embodiment of the present invention.

FIG. 10 is a graph illustrating reflectance spectra in a visible light wavelength range of a dual-mode display which includes a reflective device and an emissive device including a graphene cathode that is stacked on the reflective device according to an embodiment of the present invention.

D represents a blue reflectance spectrum, E represents a green reflectance spectrum, and F represents a red reflectance spectrum.

Referring to FIG. 10, in the blue, green, and red reflectance spectra, it may be understood that the occurrence of noise peaks were significantly decreased in comparison to A, B, and C of FIG. 9, and center wavelengths of the three-color reflectance spectra were not shifted. That is, this may be resulted from the fact that the graphene cathode having low reflectance and high transmittance prevented the multiple interference phenomenon.

Figure 11:
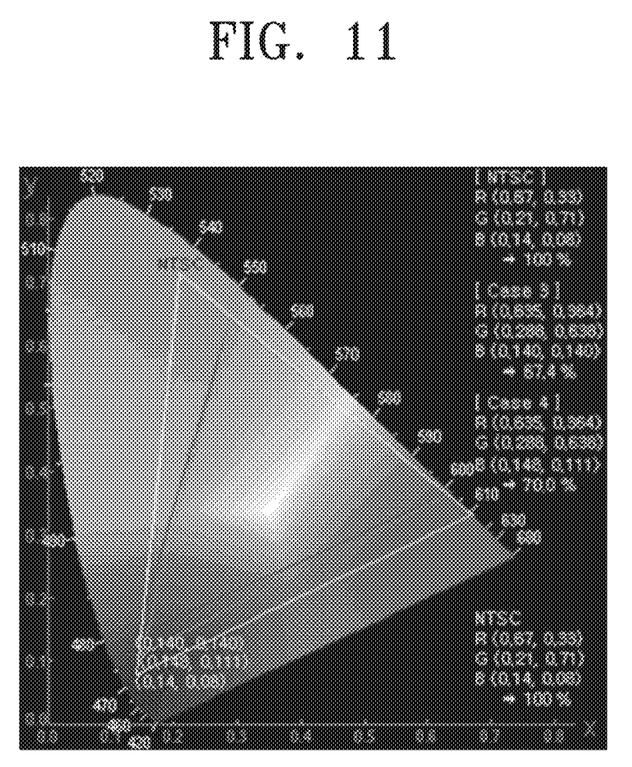
FIG. 11 is a graph illustrating a National Television Standards Committee (NTSC) color coordinate.
Figure 12:
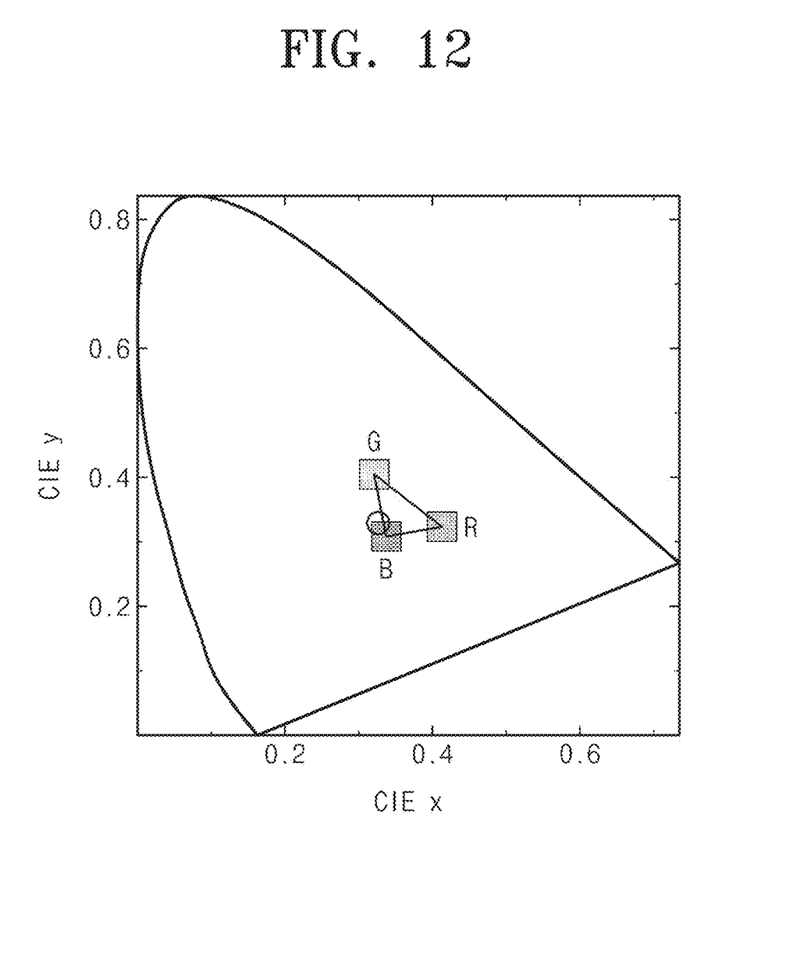
FIG. 12 is a graph illustrating color coordinates of blue, green, and red dual-mode displays including a reflective device and an emissive device including a silver cathode that is stacked on the reflective device.
Figure 13:
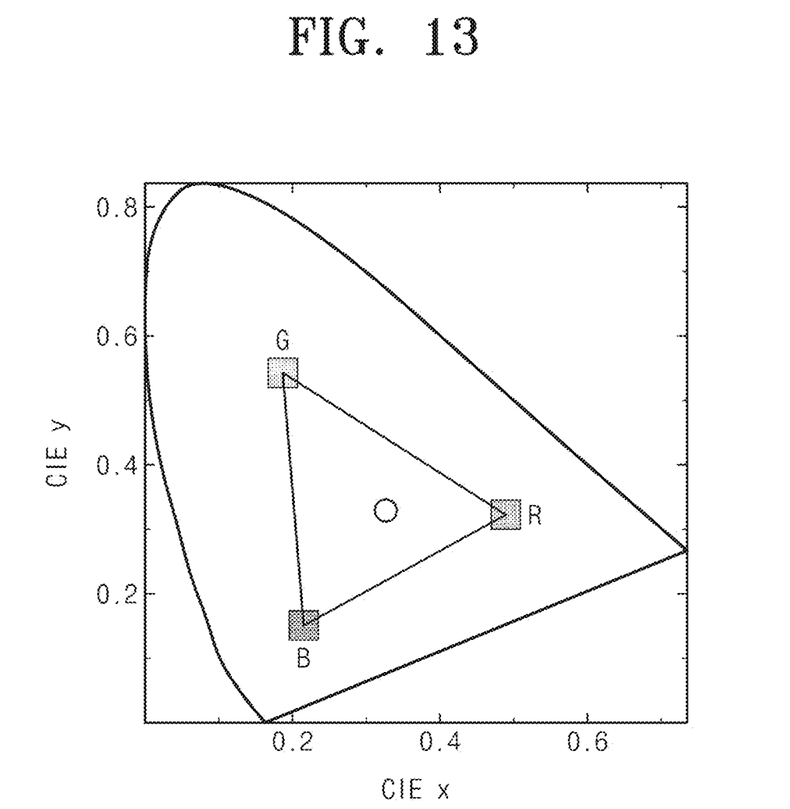
FIG. 13 is a graph illustrating color coordinates of blue, green, and red dual-mode displays including a reflective device and an emissive device including a graphene cathode that is stacked on the reflective device according to an embodiment of the present invention.

FIG. 11 is a graph illustrating a National Television Standards Committee (NTSC) color coordinate. FIG. 12 is a graph illustrating color coordinates of blue, green, and red dual-mode displays including a reflective device and an emissive device including a silver cathode that is stacked on the reflective device. FIG. 13 is a graph illustrating color coordinates of blue, green, and red dual-mode displays including a reflective device and an emissive device including a graphene cathode that is stacked on the reflective device according to an embodiment of the present invention.

Table 1 represents color reproducibility of the dual-mode display including a graphene cathode according to an example and color reproducibility of the dual-mode display including a silver cathode according to a comparative example. Referring to Table 1 simultaneously with FIGS. 11 to 13, the color reproducibility was obtained by dividing a color reproduction range (area of triangle connecting three primary colors) in color coordinate graphs by a color reproduction range of NTSC (area of triangle formed by NTSC three primary colors, 0.1582). When comparing FIG. 11 with FIG. 12, it may be confirmed that an area of the triangle of the color coordinate of the dual-mode display including a graphene cathode was wider than an area of the triangle of the color coordinate of the dual-mode display including a silver cathode. Numerically, it may be confirmed that the color reproducibility of the dual-mode display including a graphene cathode was improved about 15 times the color reproducibility of the dual-mode display including a silver cathode.

TABLE 1

|  | NTSC | | Example | | Comparative Example | |
| --- | --- | --- | --- | --- | --- | --- |
|  | X | Y | X | Y | X | Y |
| Red | 0.67 | 0.33 | 0.41697 | 0.33026 | 0.33026 | 0.49301 |
| Green | 0.21 | 0.71 | 0.32488 | 0.41101 | 0.14401 | 0.19075 |
| Blue | 0.14 | 0.08 | 0.34106 | 0.31484 | 0.31484 | 0.2151 |
| Color reproducibility with respect to NTSC | | | 35.51255 | | 2.386144 | |

$$S = 0.5 \times abs\{(Rx-Bx) \times (Gy-By) - (Gx-Bx) \times (Ry-By)\} \quad \text{Equation 1}$$

$$\text{Color Reproducibility} = S/\text{NTSC area}(0.1582) \quad \text{Equation 2}$$

According to an embodiment of the present invention, a low reflective and high transmissive material is used in an anode and a cathode of an emissive device. The low reflective and high transmissive material may be a carbon-based material including graphene sheets, graphene flakes, and graphene platelets, and a binary or ternary transparent conductive oxide including indium oxide, tin oxide, and zinc oxide. Therefore, color reproducibility and luminous efficiency of a dual-mode display may be improved.

While preferred embodiments of the present invention has been particularly shown and described with reference to the accompanying drawings, it will be understood by those of ordinary skill in the art that various changes in form and details may be made therein without departing from the spirit and scope of the present invention as defined by the following claims.

What is claimed is:

1. A dual-mode display comprising:
a substrate; and
a plurality of sub-pixels on the substrate,
wherein the plurality of sub-pixels comprise:
a reflective device having an optical filter function which reflects different colors according to electrical signals applied from outside; and
an emissive device disposed on the reflective device,
wherein the emissive device comprises a cathode and an anode, and
the cathode and the anode comprise a carbon-based material including graphene sheets, graphene flakes, and graphene platelets, and a binary or ternary transparent conductive oxide including indium oxide, tin oxide, and zinc oxide.

2. The dual-mode display of claim 1, wherein the emissive device is an organic light-emitting device.

3. The dual-mode display of claim 1, wherein the emissive device emits light from both sides thereof.

4. The dual-mode display of claim 3, wherein the reflective device reflects light of the emissive device that is emitted in a direction of the reflective device.

5. The dual-mode display of claim 1, wherein the reflective device is a microelectromechanical system (MEMS)-based reflective device, an electrowetting device, or an electrochromic device.

* * * * *